March 7, 1972 D. H. MASH 3,647,581

MANUFACTURE OF SEMICONDUCTOR DEVICES

Filed June 11, 1969

Inventor
DEREK H. MASH
By Stephen A. Young
Attorney

United States Patent Office 3,647,581
Patented Mar. 7, 1972

3,647,581

MANUFACTURE OF SEMICONDUCTOR DEVICES

Derek Hubert Mash, Harlow, Essex, England, assignor to International Telephone and Telegraph Corporation, Nutley, N.J.

Filed June 11, 1969, Ser. No. 832,360
Claims priority, application Great Britain, July 11, 1968, 33,042/68
Int. Cl. H01l 7/36
U.S. Cl. 148—175 6 Claims

ABSTRACT OF THE DISCLOSURE

A single crystal layer of semiconductor material, having a thickness greater than 50$\mu$, has an electrically active region formed within one surface. The surface with the electrically active region is temporarily attached to a substrate, and semiconductor material is then removed from the opposite surface to form a layer having a thickness of less than 20$\mu$. An epitaxially deposited layer on a substrate, with an electrically active region in said layer, may be similarly reduced in thickness by removing the substrate and a portion of said deposited layer to provide an unsupported single crystal of less than 20$\mu$ thickness.

BACKGROUND OF THE INVENTION

This invention relates to the manufacture of semiconductor devices.

In many semiconductor devices, the electrically active and significant region is limited to a very thin layer in the region of the junction or junctions.

The remaining thickness of the device consists of semiconducting material whose sole function is to act as a mechanical support for the thin active layer.

Sometimes this passive semiconductor has properties which are undesirable, for example, its electrical or thermal resistance may be too high, or it may be opaque to electromagnetic radiation which the device is emitting or detecting. Some of these problems are overcome by making the active and passive regions dissimilar. This is done by forming a thin active region with one set of characteristics on top of a thick passive layer with different characteristics. This can be done by the process of epitaxy, which permits the growth of thin layers of one set of properties on substrates of another set, providing their crystal structures are sufficiently similar. This proviso of crystal compatibility severely limits the range of properties available in the active and passive layers. For example, silicon of high resistivity can be grown epitaxially on silicon of low resistivity, but the low resistivity material cannot be much less than 0.001 ohm cm. Equally, for some devices it is desirable for the substrate to be electrically insulating, but again there is the limitation imposed by the nature of the substrate required for epitaxial growth.

In all these structures there is the implied assumption that a thick passive layer is needed to give the device mechanical strength. This assumption appears to be justified by the fact that the active region is usually less than twenty micrometers ($\mu$) thick and is often in the region of 1 to 5$\mu$ thick, and single crystal semiconductor material, such as silicon, germanium and gallium arenside, is usually very brittle and unhandleable at thicknesses of 30 to 50$\mu$.

SUMMARY OF THE INVENTION

It is an object of this invention to obtain a thinner semiconductor material which is more flexible and for many purposes is quite handleable.

According to a broad aspect of the invention there is provided a method of manufacturing a semiconductor device having an electrically active region contained in a single crystal layer of semiconductor material wherein during a stage of the manufacture the single crystal layer consists of a totally unsupported plate having a thickness of less than twenty micrometers.

According to another aspect of the invention, there is provided a method of manufacturing a semiconductor device having an electrically active region contained in a single crystal layer of semiconductor material, wherein the electrically active region is formed within a slice of single crystal semiconductor material having a thickness greater than about fifty micrometers, and wherein the thickness of the slice is then reduced to less than twenty micrometers.

According to a further aspect of the invention there is provided a method of manufacturing a semiconductor device having an electrically active region contained in a single crystal layer of semiconductor material, wherein the electrically active region is formed within a single crystal layer of semiconductor material epitaxially deposited on and supported by a suitable crystalline substrate, and wherein the whole of the substrate, and if necessary part of the single crystal layer, is then removed to reduce the thickness of the single crystal layer to less than twenty micrometers.

It is, therefore, possible to form the electrically active regions in a thick slice of single crystal semiconductor material (thicker than about 50$\mu$), to attach it for example by wax, to a rigid support, to mechanically and/or chemically or otherwise polish the attached slice down to less than 20$\mu$ thickness, and then to remove the slice from the support and use it in the free form or re-attach it to another support with the required properties, unrestricted by considerations of crystal compatability.

Alternatively, it is possible to epitaxially deposit a layer of single crystal semiconductor material on a suitable crystalline substrate, form the required active region or regions in the epitaxial layer, to reduce the thickness of the structure from the substrate side, to less than 20$\mu$ and use it in the free form or re-attach it to another support with the required properties, unrestricted by considerations of crystal compatibility.

Alternatively, it is possible to epitaxially deposit a layer of single crystal semiconductor material on a suitable crystalline substrate, form the required active region or regions in the epitaxial layer, reduce the thickness of the structure from the substrate side to less than 20$\mu$, and use it in the free form or re-attach it to another support with the required properties unrestricted by considerations of crystal compatibility.

DESCRIPTION OF THE PREFERRED EMBODIMENTS

Figure 1:
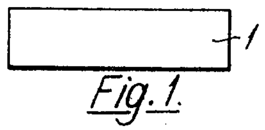
FIGS. 1 to 5 show successive stages in the manufacture of a semiconductor diode by epitaxy.
Figure 2:
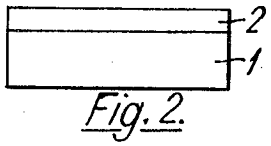
Figure 3:
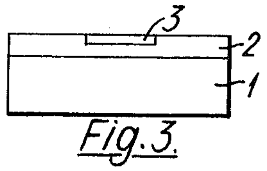

FIGS. 1 to 3 illustrate successive stages in the manufacture of a diode by conventional epitaxy. Namely, the provision of a suitable crystalline substrate 1 (FIG. 1), the epitaxial deposition thereon of a layer 2 (FIG. 2) of single crystal semiconductor material, the layer 2 having a thickness either greater than or less than 20$\mu$, and the formation in the layer 2 of a p-n junction 3 (FIG. 3) by planar junction formation techniques.

Figure 4:
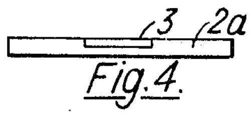

The structure shown in FIG. 3 is then subjected to chemical etching so as to completely remove the substrate 1, and if necessary that part of the layer to reduce the thickness of the layer 2 to less than 20$\mu$, to produce the thin plate 2*a* (FIG. 4) containing the junction 3.

During etching, the thickness can readily be monitored by transmission of visible light. At 15$\mu$ in sodium light, silicon has a transmission of about $10^{-3}$ rising to $10^{-1}$ at 4$\mu$. This provides a sensitive and simple indication of thickness. It was observed that silicon could be reduced to less than 1$\mu$ thickness before physically disintegrating.

Figure 5:
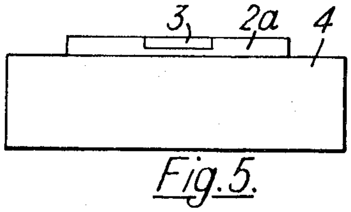
Figure 6:
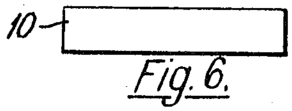
FIGS. 6 to 10 show successive stages in the manufacture of a semiconductor diode starting with a thick semiconductor layer.
Figure 7:
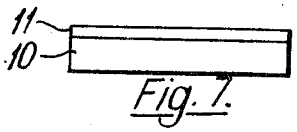
Figure 8:
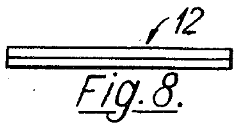

The thin plate device may be used totally unsupported, or may be mounted on a suitable substrate. Such a mounted device is shown in FIG. 5, with a substrate 4 to which the thin plate device is suitably affixed.

The substrate may be of metal such as copper, with a top coating of gold on the device mounting surface, to provide a maximum of thermal conductivity and a minimum of series resistance, so permitting much higher electrical loading of devices such as diodes, transistors, or multiple layer devices.

The substrate may be of an insulating material such as glass, ceramic mica, plastics, to provide electrical isolation of the thin plate devices.

As an example conventional planar junctions were formed in silicon, and contacts made to the p- and n-regions from the same side. The slice was then thinned to less than the depth of the junction, and its electrical characteristics measured.

The experimental details and results were as follows: $SiO_2$ was thermally grown on an *n* conductivity type silicon slice (nominal resistivity 2.7 ohm cm., epitaxial layer thickness 18$\mu$). Windows of 0.030 inch diameter were opened in the oxide, and boron diffused into a depth of 12$\mu$. The oxide was removed from the p-region and parts of the n-region, so that probe contacts could be made at the same side.

The devices were tested and found to have the following typical parameters:

Zero bias capacitance $C_0$—30 pf.
Breakdown voltage $V_B$—100—120 v., hard.

The slice was then mounted contact side down on a suitable support and mechanically polished to a thickness of 0.002 inch, then chemically thinned to 10$\mu$, the thickness being monitored by optical transmission. The moment when the junction was exposed and could be seen clearly from the back surface, differential etching occurred at the junction to form a ridge.

At this stage the devices had vertical junctions extending through the thickness of the device. The slice was handleable and electrical probes could be lowered to make contact—the slice merely bending elastically. Breakdown voltage was unchanged and still hard, in spite of the exposure of one side of the junction. The zero bias capacitance was less than 0.5 pf. Leakage current was not measurable.

An alternative method of manufacture is shown in FIGS. 6 to 10. In this method, a single crystal semiconductor slice 10 (FIG. 6) having a thickness greater than 50$\mu$, typically 0.012 inch and of n-type silicon, has formed therein by diffusion of an opposite conductivity type dopant to produce a shallow overall p-n junction 11 (FIG. 7) at a depth of 6$\mu$. The diffused slice is then stuck by wax, with the n-type region 10 uppermost, onto a temporary rigid support, and lapped and/or etched to a thickness of 12$\mu$. The slice is then removed from the rigid support, to provide the thin plate structure 12 shown in FIG. 8.

Figure 9:
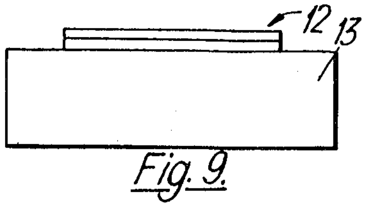
Figure 10:
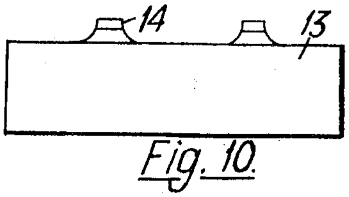

This structure is then bonded, n-type region down, onto a copper substrate 13 (FIG. 9). By utilizing conventional masking and etching techniques, mesh diodes 14 (FIG. 10) are then formed which can subsequently be separated into individual substrate mounted mesh diodes. The junction being close to the substrate permits a maximum of thermal conductivity and a minimum of series resistance.

It will be understood that multiple device manufacture e.g. arrays of diodes or transistors, may be produced in a single semiconductor slice or epitaxial layer, the slice or layer containing the devices reduced to a thickness of less than 20$\mu$, and the thinned slice then separated into individual device or device set containing chips.

Devices such as field effect transistors and high slope varactors, which rely for their effect on an insulating boundary, can be made in thin sheet silicon or gallium arsenide without recourse to epitaxial growth on insulating substrates.

Light emitting devices such as gallium arsenide or gallium arsenide phosphide diodes can be made to emit light through both surfaces, or reflectors can be used on one surface to reinforce the light through the other surface.

Light sensitive devices such as solar cells and detectors can be made in thin plate or sheet form so that the incident light can penetrate from either side.

Devices with vertical junctions, having extremely small junction areas, can be made in bulk or epitaxial material of the best quality, without sacrificing properties because of the need to grow epitaxially on insulators.

Sheets carrying devices can be mounted on top of one another to give a very high packing density.

Conductors can be provided on both surfaces of the thin plate. Junctions can be formed in the reverse side of the plate, after the step of reducing the thickness to less than 20$\mu$.

I claim:

1. A method of manufacturing a semiconductor device comprising the steps of:

(a) forming an electrically active region within one surface of a single crystal layer of semiconductor material, said layer having a thickness greater than about fifty micrometers; and (b) removing semiconductor material from said layer from the surface which is opposite said electrically active region until the overall thickness of said layer is reduced to less than 20 micrometers.

2. A method as claimed in claim 1 wherein prior to said removing step (b), said layer is attached from its surface of electrically active region to a rigid support, and said layer is then removed from said support after having its thickness reduced.

3. A method of manufacturing a semiconductor device comprising the steps of:

(a) epitaxially depositing a single crystal layer of semiconductor material on a suitable supporting single crystalline semiconductive substrate;

(b) forming an electrically active region within one surface of said layer; and (c) removing said substrate and a portion of said semiconductor material from said layer from the surface which is opposite said electrically active region to provide an unsupported single crystal layer having a thickness of less than twenty micrometers.

4. A method as claimed in claim 1 wherein after said reducing step (b), said layer is directly bonded to a further substrate having properties according to the design function of said device.

5. A method as claimed in claim 3 wherein after said removing step (c), said unsupported layer is directly bonded to a further substrate having properties according to the design function of said device.

6. A method according to claim 2 wherein wax is used to attach said layer from its surface of electrically active region to said rigid support.

References Cited

UNITED STATES PATENTS

| | | | |
|---|---|---|---|
| 3,000,768 | 9/1961 | Marinace | 148—175 |
| 3,030,189 | 4/1962 | Schweickert et al. | 148—175 |
| 3,179,542 | 4/1965 | Quinn et al. | 29—583 |
| 3,186,880 | 6/1965 | Skaggs et al. | 148—175 |
| 3,261,727 | 7/1966 | Dehmelt et al. | 148—174 |
| 3,382,099 | 5/1968 | Montmory | 148—175 |

PAUL M. COUGHLAN, Jr., Primary Examiner

G. J. CRASANAKIS, Assistant Examiner

U.S. Cl. X.R.

29—580